(12) United States Patent
Cepeda et al.

(10) Patent No.: US 6,501,647 B1
(45) Date of Patent: Dec. 31, 2002

(54) COMPUTER WITH THERMAL COOLING AND A THERMAL COOLING SYSTEM AND METHOD

(75) Inventors: Darin Cepeda, Austin, TX (US); Eduardo Escamilla, Round Rock, TX (US); Johnny Fraga, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 51 days.

(21) Appl. No.: 09/756,944

(22) Filed: Jan. 9, 2001

(51) Int. Cl.[7] ................................................ G06F 1/16
(52) U.S. Cl. .................. 361/687; 361/701; 361/707; 361/714
(58) Field of Search ........................ 361/687, 701–704, 361/707–711, 714–719

(56) References Cited

U.S. PATENT DOCUMENTS

| | | | |
|---|---|---|---|
| 5,568,360 A | 10/1996 | Penniman et al. | |
| 5,734,550 A | 3/1998 | Penniman et al. | |
| 5,777,852 A | * 7/1998 | Bell | 361/769 |
| 6,280,222 B1 | * 8/2001 | Walkup | 439/331 |

* cited by examiner

Primary Examiner—Darren Schuberg
Assistant Examiner—Yean Hsi Chang
(74) Attorney, Agent, or Firm—Haynes and Boone, LLP

(57) ABSTRACT

A thermal cooling system in which a clamp assembly clamps a heat dissipating device to a heat generating device in the chassis of an electrical device. The clamp assembly ensures that the heat dissipating device exerts a relatively high, constant, uniform pressure on the heat generating device to ensure maximum heat transfer from the heat generating device to the heat dissipating device.

19 Claims, 3 Drawing Sheets

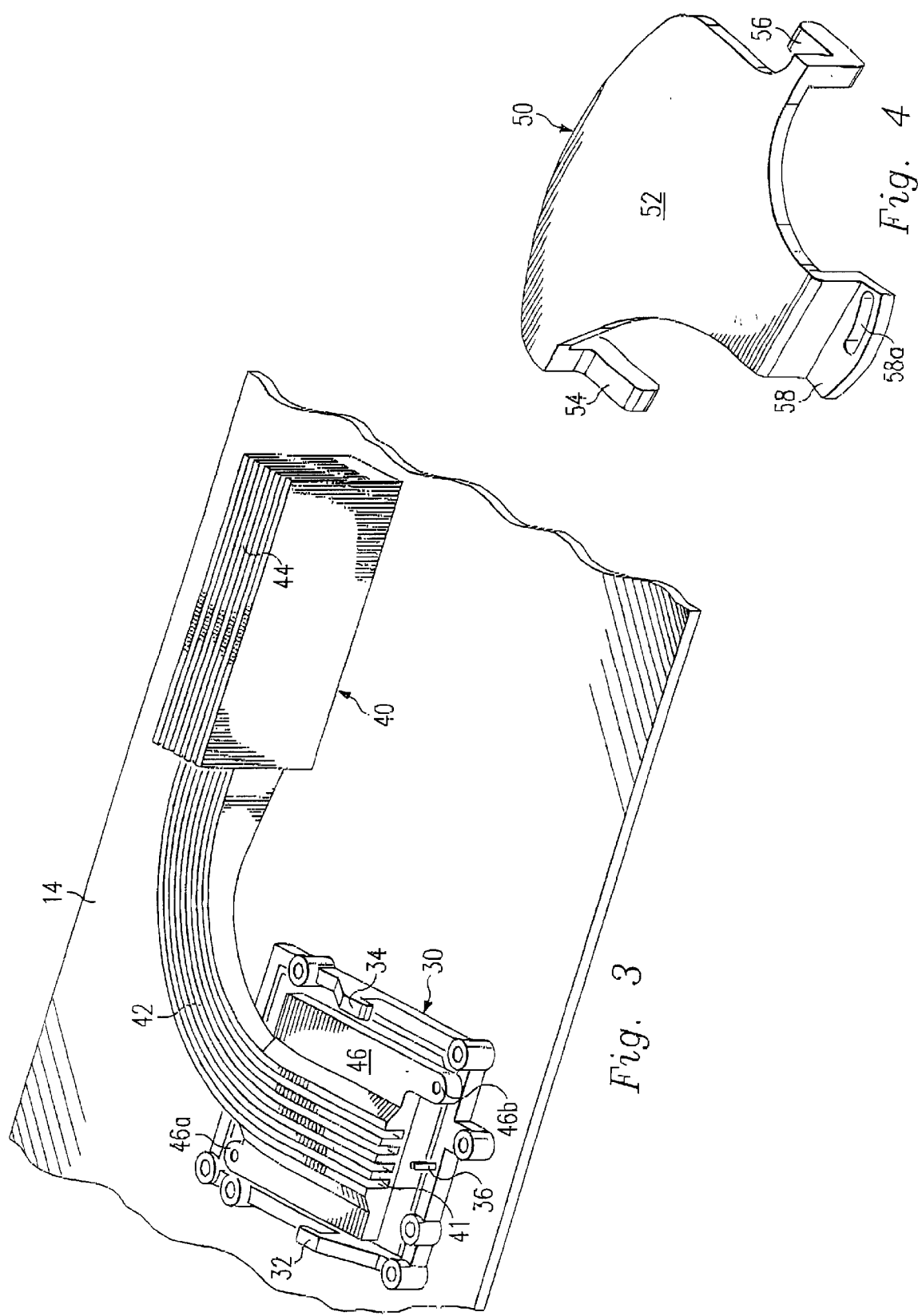

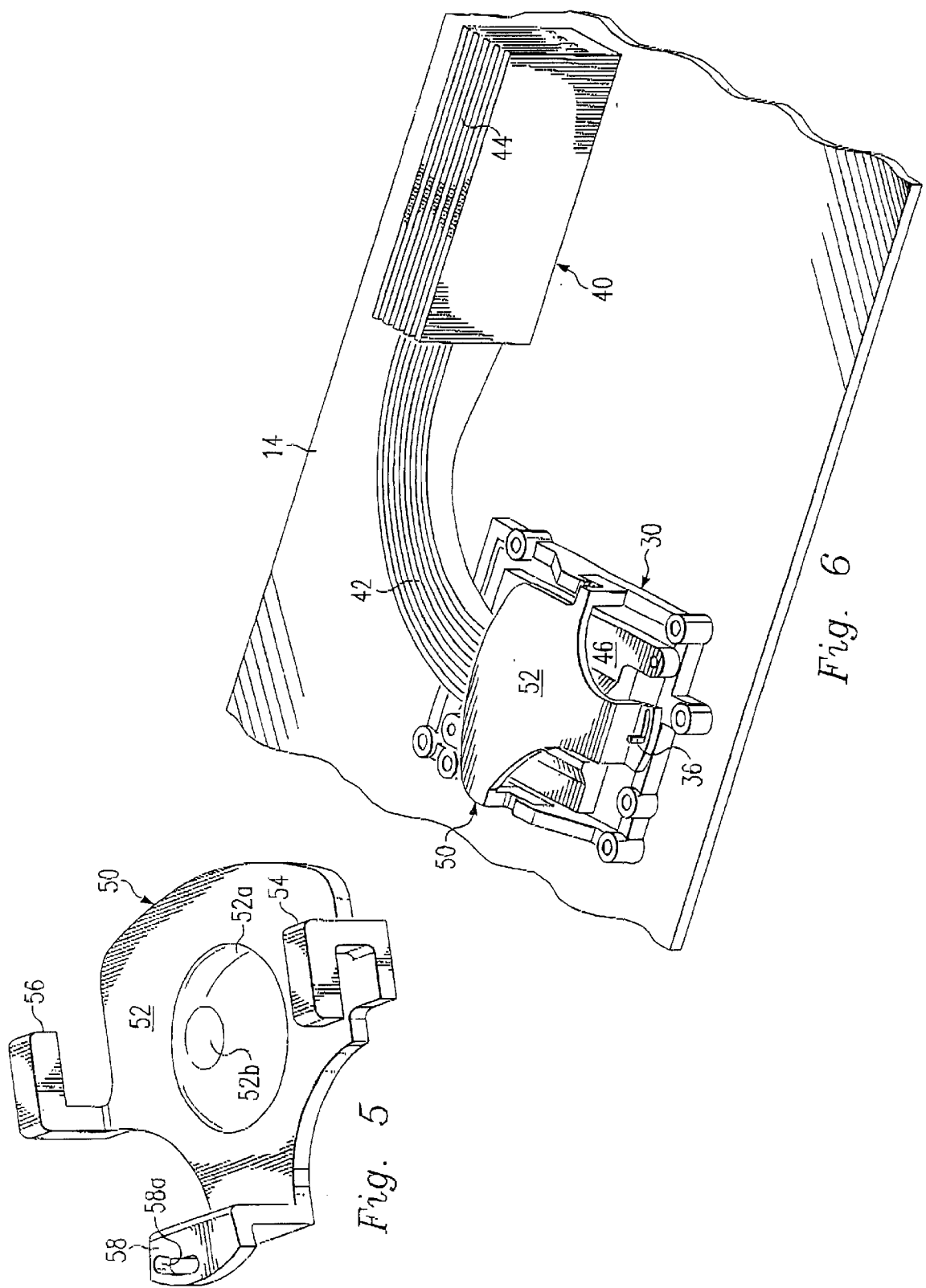

COMPUTER WITH THERMAL COOLING AND A THERMAL COOLING SYSTEM AND METHOD

BACKGROUND

The disclosures herein relates to a thermal cooling system and method for electronic devices, such as computers.

Many electronic devices, such as computers, contain heat generating devices, such as chips, processors, etc., that are disposed in a crowded area in the chassis of the device and thus cause an excessive amount of heat to accumulate in the chassis, which can cause failure of one or more of the devices.

Therefore, what is needed is a system and method for dissipating heat from a heat-generating device according to which a heat dissipating device exerts a relatively high, constant, uniform pressure on the heat generating device to ensure maximum heat transfer.

SUMMARY

One embodiment, accordingly, provides a clamp assembly that clamps the heat dissipating device to the heat generating device. The clamp assembly ensures that the heat dissipating device exerts a relatively high, constant, uniform pressure on the heat generating device to ensure maximum heat transfer from the heat generating device to the heat dissipating device.

BRIEF DESCRIPTION OF THE DRAWINGS

FIG. 3 is a view similar to that of FIG. 2 but depicts a heat dissipating unit, a portion of which extends over the frame.

FIGS. 4 and 5 are enlarged isometric views illustrating a clamp of the clamp assembly of FIG. 2.

FIG. 6 is an enlarged isometric view illustrating the clamp assembly in an assembled clamped position.

DETAILED DESCRIPTION

Figure 1:
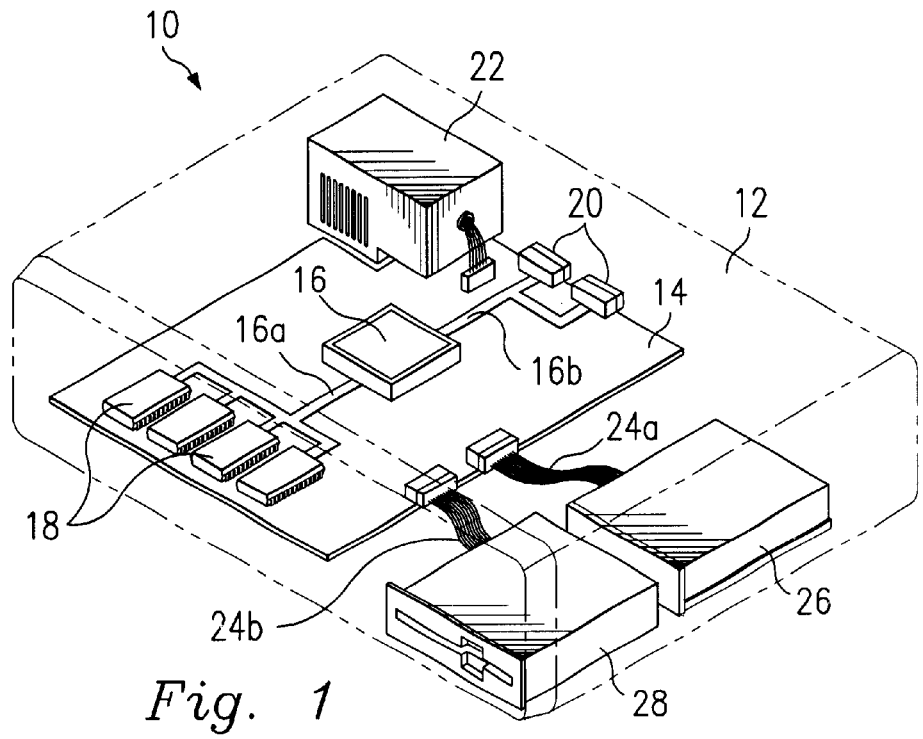
FIG. 1 is a diagrammatic view illustrating an embodiment of a computer system.

An embodiment of the present disclosure is shown in FIG. 1 in connection with a computer, referred to, in general, by the reference numeral 10, which can be in the form of a laptop computer, a notebook computer, a desktop computer, a tower computer, a server, or the like. The computer 10 includes a chassis 12 in which a motherboard 14 is mounted. A processor 16 is connected to the motherboard 14, and a plurality of memory modules 18, and two input/output (I/O) devices 20 are mounted on the motherboard. Two buses 16a and 16b are also provided on the motherboard 14 and connect the processor 16 to the memory modules 18 and to the input/output devices 20, respectively. A power supply 22 is connected to the motherboard 14, and a pair of cable assemblies 24a and 24b connect the motherboard to a hard drive unit 26 and a disk drive unit 28, respectively. It is understood that other components, electrical traces, electrical circuits and related devices (not shown) are provided in the chassis 12. Because these are all conventional, they will not be described in any further detail.

Figure 2:
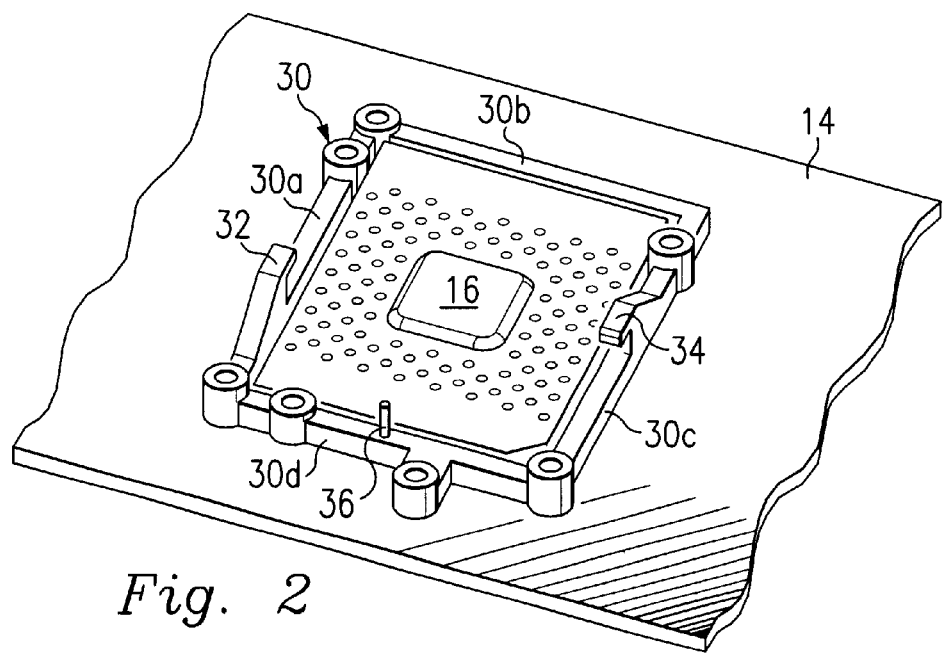
FIG. 2 is an enlarged, partial, isometric view illustrating a portion of the computer system of FIG. 1 with a frame of a clamp assembly.

FIG. 2 illustrates a frame 30 surrounding the processor 16 of FIG. 1. The frame 30 is rectangular in shape and includes several spaced mounting posts which receive fasteners to mount the frame to the motherboard 14. The walls 30a, 30b, 30c and 30d of the frame 30 are equally spaced from the corresponding edges of the processor 16, and two hooks 32 and 34 are formed on the opposite walls 30a and 30c, respectively, and extend in opposite directions. An upright pivot rod 36 extends from the center portion of the wall 30d of the frame 30.

Referring to FIG. 3, a heat dissipating device 40 has a curved arm 42 one end of which extends from a finned unit 44 that rests on the motherboard and is attached to the motherboard in any conventional manner. A base 46 is formed at the other end portion of the arm 42 and rests on the frame 30. To this end, two flanges 46a and 46b extend from opposite corners of the base 46 and rest on corresponding portions of the upper surface of the frame 30. A plurality of fins 41 are provided on the upper surface of the arm 42, and the arm is formed integrally with the finned unit 44 and the base 46.

A clamp 50 is depicted in FIGS. 4 and 5, and is formed by a plate 52 having two opposed hooks 54 and 56 extending from its opposite sides. The hooks 54 and 56 extend in opposite directions and are adapted to engage the hooks 32 and 34, respectively, of the frame 30 (FIG. 2), as will be described in detail. A flange 58 projects outwardly from the plate 42 and has a slot 58a formed there through for receiving the rod 36 (FIG. 2). As shown in FIG. 5, the underside of the plate 52 has a curved, raised portion 52a and a flat surface 52b formed at the outer portion of the raised surface, for reasons to be described.

FIG. 6 depicts the clamp 50 in its clamped position in which it clamps the base 46 of the heat dissipating device 40 into an intimate engagement with the processor 16. To attain this clamped position, the clamp 50 is positioned relative to the frame 30 so that the rod 36 of the frame extends in the slot 58a of the clamp, and so that the hooks 54 and 56 of the clamp are angularly spaced from the hooks 32 and 34 respectively, of the frame. The clamp 50 is then pivoted relative to the frame 30 so that the hooks 54 and 56 move toward the hooks 32 and 34, respectively. This pivotal movement continues until the hooks 54 and 56 engage the hooks 32 and 24, respectively. During this pivotal movement, the raised portion 52a on the plate 52 engages and cams the end portion of the arm 42 and the base 46 downwardly against the processor 16. In the clamped position of the clamp 50 shown, the flat plate surface 52b engages the upper surface of the end portion of the arm 42. The engagement of the hooks 54 and 56 with the hooks 32 and 34, respectively, maintain the clamp 50 in its clamped position.

As a result of the above, the clamp 50, and therefore the corresponding end portion of the arm 42 and the base 46, exert a relatively high, constant, uniform pressure on the processor 16 to ensure maximum heat transfer from the processor to the arm 42. The heat is further transferred, via the remaining portion of the arm 42 to the finned unit 44 of the heat dissipating unit 40. It is understood that a fan, or the like can be associated with the computer chassis 12 for removing this heat from the finned unit 44, in a conventional manner.

It is understood that variations may be made in the foregoing without departing from the scope of the disclosed embodiments. For example, the above embodiment is not limited to a computer, but is equally applicable to any electrical device containing a heat generating device. Also, the heat dissipating device 40 can be clamped to any other heat generating device that may be present in the chassis 12 or in any electronic device. Further, the frame 30 does not have to surround the processor 16, but can take any position relative to the processor as long as it is proximate to the processor and can receive the clamp 50 and enable it to exert the above clamping action. Still further, the heat dissipating unit 40, including the arm 42, the finned unit 44, and the base 46 can take shapes other than the ones disclosed above. It is understood that the spatial references referred to above, such as "upper", "lower", "downward", "vertical", "horizontal", etc. are made for the purposes of example only and are not intended to limit the specific orientation of the particular structure involved.

Because other modifications, changes, and substitutions are intended in the foregoing disclosure, it is appropriate that the appended claims be construed broadly and in a manner consistent with the scope of the embodiments disclosed herein.

What is claimed is:

1. A computer system comprising;
   a chassis;
   a motherboard disposed in the chassis;
   a heat generating device disposed on a first portion of the motherboard;
   a heat dissipating device disposed in the chassis on a second portion of the motherboard;
   a heat dissipating arm extending from the heat dissipating device to the heat generating device;
   a frame disposed proximate to the heat generating device; and
   a clamp rotatable relative to the frame from a non-clamping position to a clamping position in which it engages the heat dissipating arm and forces it into contact with the heat generating device, the clamp having a camming surface formed thereon which engages the heat dissipating arm during the rotation of the clamp and forces the arm into contact with the heat generating device.

2. The computer system of claim 1 further comprising at least one hook formed on the frame and at least one hook formed on the clamp, each hook on the clamp engaging a corresponding hook on the frame to maintain the clamp in its clamping position.

3. The computer system of claim 1 wherein the camming surface of the clamp engages a finned surface of the heat dissipating arm.

4. The computer system of claim 3 wherein the camming surface has a curved raised surface that engages the heat dissipating arm during the movement of the clamp, and a flat surface formed on an outer portion of the raised surface that engages the heat dissipating arm when the clamp is in its clamping position.

5. The computer system of claim 1 wherein the clamp exerts a constant, uniform pressure on the heat dissipating arm to ensure maximum heat transfer from the heat generating device to the heat dissipating device.

6. The computer system of claim 1 wherein the frame surrounds the heat generating device.

7. The computer system of claim 1 wherein the heat generating device is a processor.

8. A clamping assembly for clamping a heat dissipating member to a heat generating member in an electrical device, the clamping assembly comprising:
   a heat generating device mounted on a first portion of a chassis;
   a heat dissipating device mounted on a second portion of a chassis;
   a heat dissipating arm extending from the heat dissipating device to the heat generating device;
   a frame mounted proximate to the heat generating device; and
   a clamp mounted on the frame and rotatable relative to the frame from a non-clamping position to a clamping position in which it engages the heat dissipating arm and forces it into contact with the heat generating device, the clamp having a camming surface which engages the heat dissipating arm during rotation of the clamp.

9. The assembly of claim 8 further comprising at least one hook formed on the frame and at least one hook formed on the clamp, each hook on the clamp engaging a corresponding hook on the frame to maintain the clamp in its clamping position.

10. The assembly of claim 8 wherein the camming surface of the clamp engages a finned surface of the heat dissipating arm.

11. The assembly of claim 10 wherein the camming surface has a curved raised surface that engages the heat dissipating arm during the rotation of the clamp, and a flat surface formed on an outer portion of the raised surface that engages the heat dissipating arm when the clamp is in its clamping position.

12. The assembly of claim 8 wherein the clamp exerts a constant, uniform pressure on the heat dissipating arm to ensure maximum heat transfer from the heat generating device to the heat dissipating device.

13. The assembly of claim 8 wherein the frame surrounds the heat generating device.

14. A method for clamping a heat dissipating device to a heat generating device in an electrical device, the method comprising:
   providing a chassis;
   mounting a heat generating device on a first portion of the chassis;
   mounting a heat dissipating device on a second portion of the chassis;
   extending a heat dissipating arm from the heat dissipating device to the heat generating device;
   mounting a frame proximate to the heat generating device;
   mounting a clamp on the frame, the clamp having a camming surface which engages the heat dissipating arm; and
   rotating the clamp from a non-clamping position to a clamping position in which the camming surface forces the heat dissipating arm into contact with the heat generating device.

15. The method of claim 14 further comprising engaging at least one hook formed on the clamp with at least one hook formed on the frame to maintain the clamp in its clamping position.

16. The method of claim 14 wherein the camming surface of the clamp engages a finned surface of the heat dissipating arm.

17. The method of claim 16 further comprising providing the camming surface with a curved raised surface that engages the heat dissipating arm during the movement of the clamp, and a flat surface formed on an outer portion of the raised surface that engages the heat dissipating arm when the clamp is in its clamping position.

18. The method of claim 14 further comprising exerting a constant, uniform pressure on the heat dissipating arm to ensure maximum heat transfer from the heat generating device to the heat dissipating device.

19. The method of claim 14 further comprising surrounding the heat generating device with the frame.

* * * * *